United States Patent [19]

Bih

[11] Patent Number: 5,576,125
[45] Date of Patent: Nov. 19, 1996

[54] METHOD FOR MAKING AN OPTICAL PELLICLE

[75] Inventor: Qoang R. Bih, San Jose, Calif.

[73] Assignee: Micro Lithography, Inc., Sunnyvale, Calif.

[21] Appl. No.: 507,832

[22] Filed: Jul. 27, 1995

[51] Int. Cl.$^6$ .................................................. G03F 9/00
[52] U.S. Cl. ........................ 430/5; 428/14; 428/421; 156/645.1
[58] Field of Search ............................... 430/5; 428/14, 428/421; 156/645, 273.3

[56] References Cited

U.S. PATENT DOCUMENTS

| | | | |
|---|---|---|---|
| 4,470,508 | 9/1984 | Yen | 206/334 |
| 4,737,387 | 4/1988 | Yen | 428/14 |
| 4,759,990 | 7/1988 | Yen | 428/421 |
| 5,154,791 | 10/1992 | Gasser et al. | 156/273.3 |
| 5,168,993 | 12/1992 | Yen | 206/316.1 |
| 5,203,961 | 4/1993 | Yen | 156/645 |
| 5,254,375 | 10/1993 | Yen | 428/14 |
| 5,271,803 | 12/1993 | Yen | 156/645 |
| 5,305,878 | 4/1994 | Yen | 206/316.1 |
| 5,314,728 | 5/1994 | Yen | 428/14 |
| 5,332,604 | 7/1994 | Yen | 428/14 |
| 5,339,197 | 8/1994 | Yen | 359/359 |
| 5,453,816 | 9/1995 | Wang | 355/75 |

*Primary Examiner*—S. Rosasco
*Attorney, Agent, or Firm*—Kolisch, Hartwell, Dickinson, McCormack & Heuser

[57] ABSTRACT

A method for manufacturing an optical pellicle is disclosed. The method includes the dispensing a quantity of adhesive onto a pellicle membrane in a pattern corresponding to the shape of a pellicle frame, positioning the pellicle membrane and the pellicle frame so that the adhesive and the frame are aligned, and mounting the pellicle membrane and the pellicle frame by bringing the adhesive into contact with the pellicle frame. In one embodiment of the present invention, the pellicle membrane is tensed prior to the application of adhesive onto the membrane. Additionally, other embodiments of the present invention include the applying the adhesive with a dispenser having either a rigid or a flexible distal portion, or a dispenser tip having a distal portion comprising a flexible both a rigid portion and a flexible portion, with the flexible portion at least partially disposed within and partially protruding from the rigid portion.

20 Claims, 2 Drawing Sheets

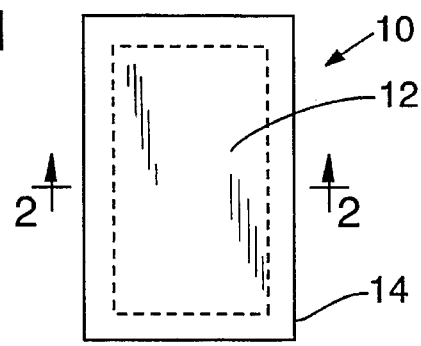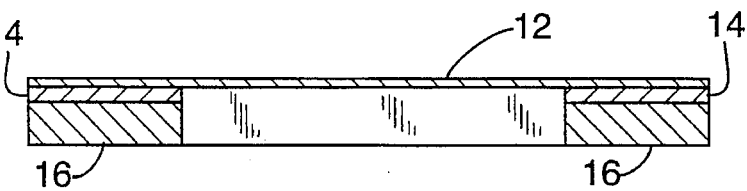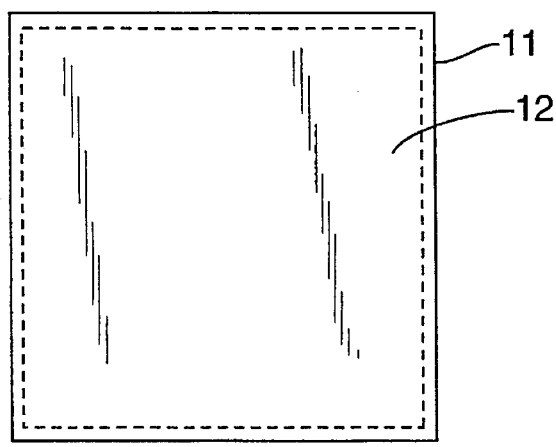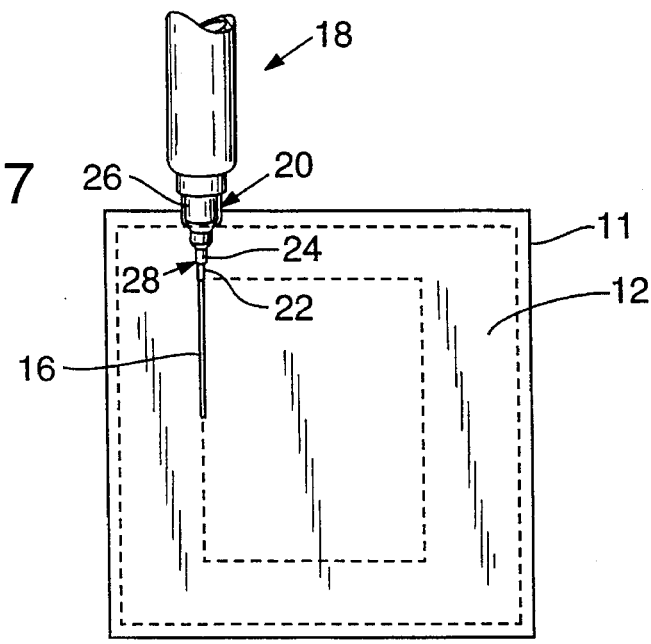

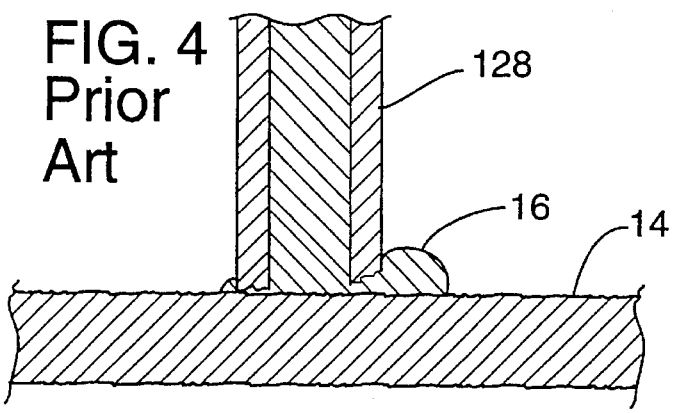
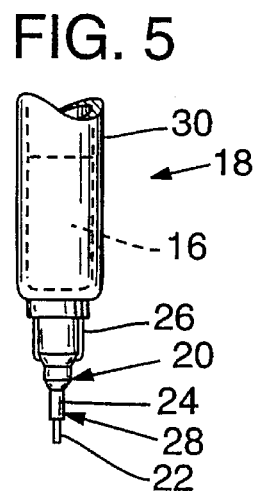
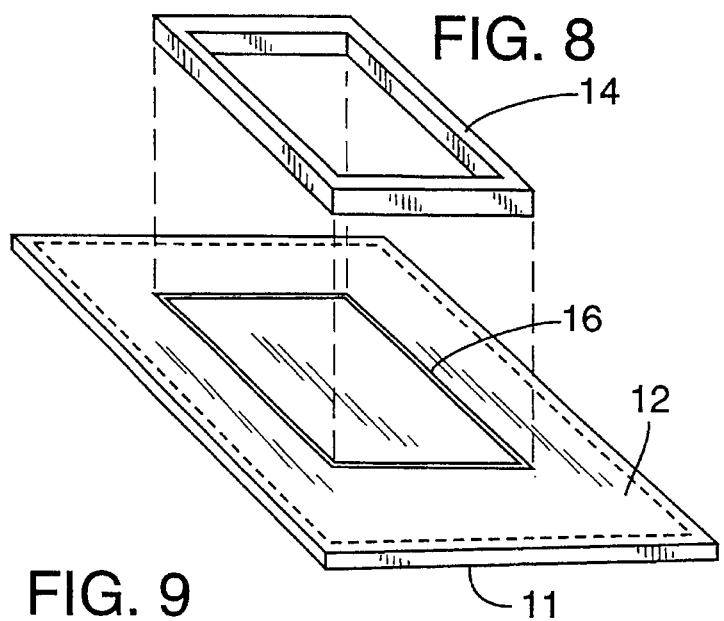
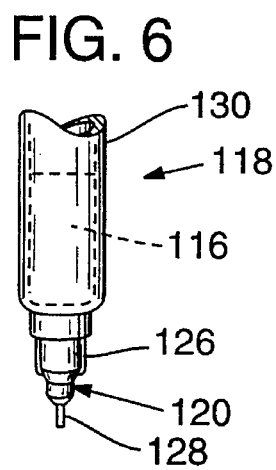
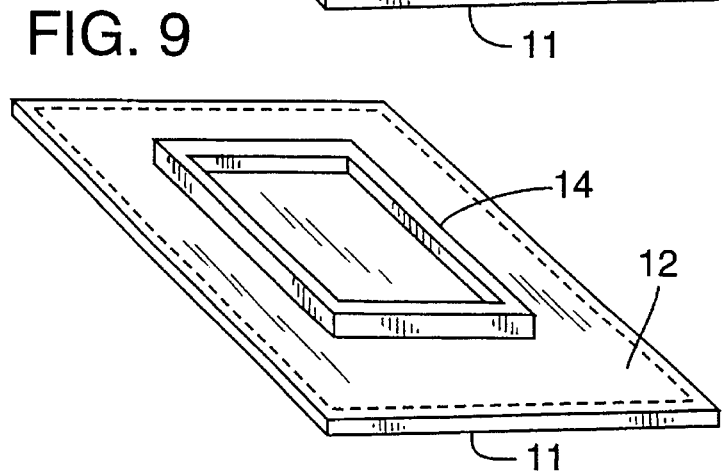
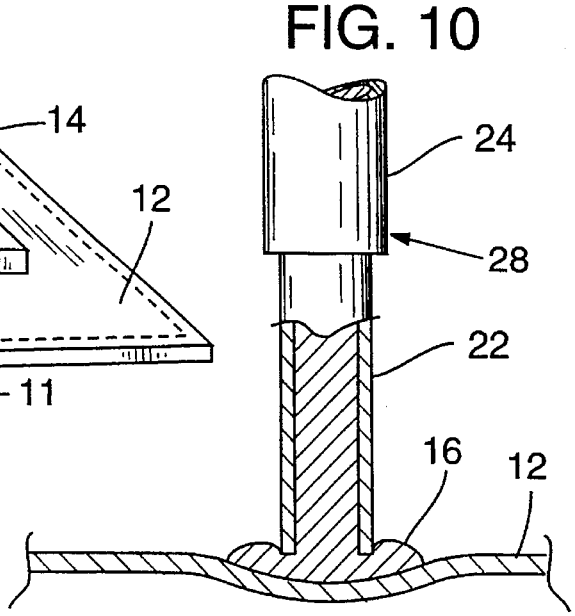

METHOD FOR MAKING AN OPTICAL PELLICLE

BACKGROUND OF THE INVENTION

The present invention relates to pellicles that are used in photolithography operations, and more particularly to a method for manufacturing optical pellicles.

In the semi-conductor chip industry it is well known that pattern transfer from the photomask to substrate is accomplished by exposing a mask to a light source. During the pattern transfer process, also called the photolithographic process, patterns on the photomask are projected onto the substrate which has been treated with a photosensitive substance. This results in the mask etching being reproduced onto the substrate. Unfortunately, any foreign substance on the surface of the mask will also be reproduced on the substrate and therefore will interfere with proper pattern transfer to the substrate.

To eliminate contamination of the mask surface, a framed, thin membrane known as a pellicle is mounted on the mask surface, such that the pellicle membrane extends parallel to the mask at a predetermined distance spaced away from it. Any contamination which would ordinarily land on the mask surface instead falls onto the pellicle membrane.

Pellicles substantially eliminate the above problem because contamination on the pellicle membrane will not be projected onto the substrate. The frame of the pellicle supports the membrane at a distance spaced away from the mask surface so any particles or other contaminants on the pellicle membrane will be out of focus during pattern transfer.

The use of pellicles can increase the quality of the resulting circuit, thereby dramatically improving circuit fabrication productivity. Consequently, it is no surprise that pellicle manufacturing techniques have become increasingly important because high quality pellicles are critical to the success of the photolithographic process.

During the pellicle manufacturing process, it is important to minimize the possibility of either relatively large or small contaminant particles being deposited on the pellicle membrane. Relatively large particles are unacceptable because they may be reproduced in the substrate during photolithography even though they are out of focus. Equally unacceptable are particles (whether large or small) that are deposited on the underside of the pellicle membrane or on the pellicle frame. Such particles may drop onto the mask surface during photolithography which is precisely what is to be avoided by using pellicles.

It is also critical that the pellicle membrane be extremely uniform across its surface. This is so that the light passing through the membrane during lithography is unobstructed and is not in any way refracted. Thus, the composition of the membrane must be highly uniform, and the membrane must be evenly tensioned across the pellicle frame. Also, it is important to ensure that a continuous seal exists between the thin film and the frame.

To further understand these important requirements, it is necessary to provide an explanation as to how pellicles are formed. As is known in the art, forming a free-standing membrane is the first step in pellicle manufacture. Commonly the membrane is prepared by spinning a suitable polymer, such as nitrocellulose or some other cellulose-based polymer, on a substrate. The newly formed membrane is then removed from the substrate and held under tension, adjacent its periphery, to prepare it for subsequent manufacturing steps.

Next, a frame is fastened, or bonded, to a working area of the membrane, framing the working area. Currently, this fastening step involves applying an adhesive to a pellicle frame, followed by mounting the pellicle membrane onto the frame. When applying the adhesive, it is important that the adhesive is applied with a uniform bead in a very thin layer. Some existing manufacturing methods utilize an adhesive dispenser which contacts the pellicle frame when applying the adhesive. Others maintain a spaced relationship between the dispenser and the frame. In both of these methods, inspection of the adhesive dispensing process is very difficult.

In existing methods which utilize an adhesive dispenser that contacts the pellicle frame, the dispenser tip is generally selected to be either rigid or flexible. The problem with rigid dispenser tips which contact the pellicle frame is that they are prone to leaving scratches or marks on the pellicle frame. These marks generally remain, even if the pellicle is subsequently polished or lapped. The applied adhesive may also flow into the scratches, resulting in non-uniform and overly broad spreading of the adhesive. Rigid dispenser tips may also become worn from contacting the pellicle frame. This deformation results in non-uniform dispensing of the adhesive. Flexible dispenser tips are less likely to leave dispensing marks or scratches on the frame, but they are more easily worn out and deformed.

Manufacturing methods which maintain a spaced relationship between the adhesive dispenser and the pellicle frame present different problems. One primary problem is controlling the dispensing gap between the pellicle frame and the adhesive dispenser. This problem is exacerbated by the fact that not all pellicle frames are of the same thickness.

Some existing methods of producing pellicles involve hand-dispensing the adhesive onto the pellicle frame. The problem with hand-dispensing methods is that it is very difficult to achieve the required uniform, thin layer of adhesive. Acetone may be used to dilute the adhesive, but this raises the additional problem that it is hard to control the rate of evaporation of acetone.

A further problem with existing methods arises if any oil is present on the pellicle frame. This oil reduces the affinity between the applied adhesive and the pellicle frame, resulting in a broader, non-uniform layer of adhesive.

Accordingly, it is a general object of the present invention to provide a new method for manufacturing optical pellicles which avoids the drawbacks and limitations of the prior art methods. More specifically, the invention has an object to develop a manufacturing method which provides an improved system for mounting the free-standing pellicle membrane to the pellicle frame. It is a further object of the present invention to develop a pellicle manufacturing method which allows easy inspection of the adhesive dispenser.

Still another object of the present invention is to provide a method of applying adhesive for bonding the pellicle membrane to the pellicle frame, which is readily suited to being a part of a highly automated, easily repeatable, process. Yet another object of the present invention is to provide a method for manufacturing optical pellicles in which the pellicle membrane can be very precisely positioned on a pre-cut pellicle frame.

SUMMARY OF THE INVENTION

One aspect of the invention comprises a method which includes the steps of: (1) dispensing a quantity of adhesive onto a pellicle membrane in a pattern corresponding to the shape of a pellicle frame; (2) positioning the pellicle membrane and the pellicle frame relative to each other such that the adhesive and the frame are aligned; and (3) mounting the pellicle membrane on the pellicle frame by bringing the adhesive-covered portion of the pellicle membrane into contact with the pellicle frame. In one aspect of the invention, the dispensing step includes using an adhesive dispenser which operatively engages the pellicle membrane. In other variations of the invention, the dispenser includes a dispenser tip having a distal portion which may be selected to be either flexible or rigid.

Another aspect of the invention comprises a method which includes the steps of: (1) tensioning a pellicle membrane; (2) dispensing a quantity of adhesive onto the pellicle membrane corresponding to the shape of a pellicle frame; and (3) attaching the pellicle frame the pellicle membrane so that the adhesive adheres the pellicle membrane to the pellicle frame. Variations of this further aspect of the present invention include using a dispenser which operatively engages the pellicle membrane, as well as using a dispenser which includes a dispenser tip having either a rigid or a flexible distal portion.

Yet another aspect of the present invention is to use a dispenser tip having a distal portion comprising both a flexible tube and a rigid sleeve, with the flexible tube at least partially disposed within and partially protruding from the rigid sleeve.

Still another aspect of the present invention is to use an adhesive selected to retain its spatial and positional integrity and its adhesive properties over extended time periods, agitation and exposure to electromagnetic radiation such as that utilized in pellicle film inspection, as well as exposure to ultraviolet and other light used in conventional photolithography applications.

Various other features, objects and advantages of the present invention will become more fully apparent as this description continues.

BRIEF DESCRIPTION OF THE DRAWINGS

FIG. 1 is an a top plan view of an optical pellicle constructed in accordance with the present invention;

FIG. 2 is an enlarged side elevation sectional view of the pellicle of FIG. 1, taken along line 2—2 of FIG. 1, with the thickness of the adhesive layer and the membrane being exaggerated for illustration purposes;

FIG. 3 is a top plan view of a free-standing pellicle membrane;

FIG. 4 is an enlarged side elevation sectional view of a prior art system showing application of the adhesive directly onto the pellicle frame, with the unevenness of the pellicle frame and the adhesive distribution exaggerated for purposes of illustration;

FIG. 5 is an enlarged side elevation sectional view of an adhesive dispenser which can be used to make the pellicle shown in FIGS. 1 and 2, and FIG. 6 is an enlarged side elevation sectional view of an alternate embodiment of the adhesive dispenser in FIG. 6.

FIGS. 7–9 illustrate the steps in the manufacturing of the pellicle shown in FIGS. 1 and 2, with FIG. 7 showing application of adhesive to the membrane, FIG. 8 positioning the pellicle frame over the pellicle membrane, and FIG. 9 showing the pellicle frame mounted to the pellicle membrane; and FIG. 10 is a side elevation sectional view showing how the application of the adhesive may deflect the pellicle membrane, with the thickness of the membrane being exaggerated for purposes of illustration.

DETAILED DESCRIPTION OF THE PREFERRED EMBODIMENT

Turning now to the drawings, FIGS. 1 and 2 depict a conventional optical pellicle 10 which is used as a dust cover in photolithography applications as described above. Pellicle 10 includes a pellicle membrane 12 and a pellicle frame 14, with the membrane and frame being mounted together with a layer of adhesive 16. Pellicle 10 is designed to be placed directly onto a photomask (not shown) to prevent dust from falling onto the surface of the photomask. Instead, dust or other particulate will fall onto the pellicle membrane 12, thereby maintaining such particulate at a distance spaced from the surface of the photomask. Thus, such particulate will be out of focus in the photolithography operation and will therefore not normally be reproduced in the silicon wafer (not shown) positioned a predetermined distance below the photomask (not shown).

As noted above, pellicle membrane 12 is normally fabricated of nitrocellulose or some other cellulose-based polymer such as cellulose acetate. That material is typically first dissolved in a suitable solvent and is then spun onto a substrate, after which the solvent is baked off. The membrane is then removed from the substrate, while being supported at its edges by a perimeter frame of some sort. That perimeter frame is one that is used during the fabrication process and is different from the pellicle frame 14 shown in FIGS. 1 and 2 and on which the pellicle membrane is sold and then used.

The present invention deals with a process for mounting the perimeter-mounted free-standing membrane to that final pellicle frame 14. This process utilizes a suitable adhesive 16 which is selected and designed to be complementary and not degrading to the pellicle membrane. It also is selected to retain its spatial and positional integrity and its adhesive properties over extended time, agitation and exposure to electromagnetic radiation such as that utilized in pellicle film inspection. Adhesive 16 is also selected to maintain complete positional integrity such that it does not fragment or migrate subsequent to application. Preferably, adhesive 16 is selected to be a UV-cured adhesive such as Norland Optical Adhesive No. 65, marketed by Norland Products, Inc. Alternatively, Norland 81 or 61 adhesive, or other similar adhesives or conventional epoxies, may be utilized.

Pellicle frame 14 is depicted as being rectangular and oblong in configuration, but it should be understood that pellicle frames are of a wide variety of configurations depending upon the photolithography equipment with which they are used. Pellicle frames are typically fabricated of anodized aluminum, although they could be constructed of a variety of other materials.

FIG. 3 is a top plan view of a free-standing pellicle membrane 12. As mentioned above, pellicle membrane 12 is typically formed of a cellulose-based compound such as nitrocellulose or cellulose acetate. While membrane 12 is described as free-standing, it will be understood by those in the art that such a membrane will have to be supported at its edges by some sort of perimeter frame, which has been schematically shown at 11.

FIG. 4 is an enlarged side elevation sectional view of a prior art system showing application of adhesive 16 directly onto a pellicle frame 14. Only the distal portion 28 of the dispenser tip 20 is shown. For purposes of illustration, the unevenness of the adhesive distribution has been exaggerated. As previously discussed, by contacting the pellicle frame 14, the distal portion 28 of the dispenser tip 20 becomes worn and uneven. Once this occurs, the adhesive 16 is dispensed in a broader, uneven fashion. Furthermore, the contact between the pellicle frame 14 and the dispenser 18 is likely to cause marks or scratches on the pellicle frame 14. These scratches further impair the quality of the finished pellicle 10.

FIG. 5 is an enlarged side elevation sectional view of an adhesive dispenser 18 which can be used to make the pellicle shown in FIGS. 1 and 2. The dispenser 18 contains body portion 30 and a dispenser tip 20. The dispenser tip 20 includes a first portion 26 which engages the body portion 30 and a distal portion 28 which extends outwardly from the first portion 26. The distal portion 28 comprises a rigid sleeve 24 and a flexible tube 22. The flexible tube 22 is partially disposed within and partially protrudes from the rigid sleeve 24.

The rigid sleeve 24 is typically fabricated of stainless steel with a 0.030" inner diameter and a 0.050" outer diameter. The flexible tube 22 is typically fabricated of Teflon™, with a 0.005" inner diameter and a 0.029" inner diameter. The rigid sleeve 24 provides greater position control of the applied adhesive 16. The flexible tube 22 significantly reduces the possibility of the pellicle membrane 12 being broken when the adhesive 16 is applied. A suitable dispenser tip 18 is manufactured by EFD of East Providence, R.I. In the EFD tip, the rigid sleeve 24 is partially crimped to secure a portion of the flexible tube 22 within the rigid sleeve 24. The EFD tip has been used for a wide variety of purposes, including application of adhesive directly to the pellicle frame, as shown in FIG. 4. The described EFD dispenser constitutes prior are to the present invention.

FIG. 6 is an enlarged side elevation sectional view of an alternate embodiment of the adhesive dispenser shown in FIG. 5. In this embodiment, the dispenser is shown at 118 and includes a body portion 130 and a dispenser tip 120. The dispenser tip 120 contains a first portion 126 which engages the body portion 130 and a distal portion 128 which extends outwardly from the first portion 126. The distal portion 128 may be fabricated of either a rigid or a flexible material. The difference between dispenser 118 and dispenser 18 is that dispenser 118 contains a distal portion 130 which may be fabricated of either a rigid or a flexible material. The distal portion 30 of dispenser 18, on the other hand, contains both a rigid sleeve 24 and a flexible tube 22, with the flexible tube 22 at least partially disposed within and partially protruding from the rigid sleeve 24.

In FIG. 7, an adhesive dispenser 18 is shown dispensing a quantity of adhesive 16 onto the pellicle membrane 12 shown in FIG. 3. The adhesive 16 is dispensed in a pattern corresponding to the shape of a pellicle frame 14. The dispenser 18 may be positioned to maintain a slight gap between the distal portion 28 of the dispenser tip 20 and the pellicle membrane 12, as shown in FIG. 10. Preferably, the distal portion 28 operatively engages the membrane 12 as it applies the adhesive 16. This provides for increased position and quantity control of the applied adhesive 16. As used in the context of this invention, "operatively engage" and "operatively engages" describe the interaction between the distal portion 28 of the dispenser tip 20 and the pellicle membrane 12 as the adhesive 16 is applied. This includes deflection of the pellicle membrane 12 caused by the cooperation of the distal portion 28 being located proximate the pellicle membrane 12 and the flow of the adhesive 16 from the distal portion 28, as well as deflection caused by the distal portion 28 of the dispenser tip 20 actually contacting the pellicle membrane 12. FIG. 10 is an enlarged side sectional view showing the dispenser tip of FIG. 7 operatively engaging the pellicle membrane 12 as the adhesive 16 is applied. Furthermore, the flexible nature of the pellicle membrane 12 facilitates this "engagement" without marking or breaking the pellicle membrane 12. It should be understood that "operatively engage" and "operatively engages" also encompass contact of the pellicle membrane 12 by the distal portion 28 in which the pellicle membrane 12 is not deflected.

In FIG. 8, a pellicle frame 14 and the pellicle membrane 12 are positioned so that the pellicle frame 14 and the pattern of applied adhesive 16 are aligned. Finally, in FIG. 9, the pellicle membrane 12 is mounted onto the pellicle frame 14 by bringing the adhesive 16 and the pellicle frame 14 into contact with each other.

FIGS. 7–9 show a pellicle frame 14 being positioned above and mounted onto a pellicle membrane 12. However, it should be understood that the method of the present invention may also be practiced by mounting a pellicle membrane 12 onto a pre-cut pellicle frame 14.

In an alternate embodiment of the method of the present invention, the pellicle membrane 12 is tensed prior to the application of the adhesive 16. After the adhesive 16 is dispensed onto the pellicle membrane 12 in a pattern corresponding to the shape of the pellicle frame 14, the pellicle frame 14 and the pellicle membrane 12 are attached so that the adhesive 16 adheres the pellicle membrane 12 to the pellicle frame 14.

While a generally rectangular pellicle has been depicted, conventional pellicles also take other shapes, such as circular or more oblong in rectangular configuration. The present invention may be utilized with any of these systems.

Furthermore, when mounting the pellicle membrane 12 onto the pellicle frame 14, the method of the present invention may be practiced whether the pellicle membrane 12 is brought into contact with the pellicle frame 14, whether the pellicle frame 14 is brought into contact with the pellicle membrane 12, or whether the pellicle frame 14 and the pellicle membrane 12 are simultaneously brought into contact with each other.

It should be understood that these and other modifications to the depicted embodiments are within the spirit and scope of the present invention and the claims of this disclosure.

It is claimed and desired to secure by Letters Patent:

1. A method of preparing an optical pellicle having a pellicle membrane and a pellicle frame, comprising:

dispensing a quantity of adhesive onto the pellicle membrane in a pattern corresponding to the shape of the pellicle frame;

positioning the pellicle membrane and the pellicle frame relative to each other such that the adhesive and the frame are aligned; and mounting the pellicle membrane onto the pellicle frame by bringing the adhesive-covered portion of the pellicle membrane into contact with the pellicle frame.

2. The method of claim 1, wherein the dispensing step includes applying the adhesive with an adhesive dispenser having a dispenser tip with a flexible distal portion.

3. The method of claim 1, wherein the dispensing step includes applying the adhesive with an adhesive dispenser having a dispenser tip with a rigid distal portion.

4. The method of claim 1, wherein the dispensing step includes applying the adhesive with an adhesive dispenser having a body portion and a dispenser tip, the dispenser tip comprising a first portion which engages the body portion of the dispenser and a distal portion extending outwardly from the first portion, the distal portion including a flexible tube and a rigid sleeve, the flexible tube at least partially disposed within and protruding from the rigid sleeve.

5. The method of claim 1, wherein the dispensing step includes applying the adhesive with an adhesive dispenser which operatively engages the pellicle membrane.

6. The method of claim 5, wherein the dispensing step includes applying the adhesive with an adhesive dispenser having a dispenser tip with a flexible distal portion.

7. The method of claim 5, wherein the dispensing step includes applying the adhesive with an adhesive dispenser having a dispenser tip with a rigid distal portion.

8. The method of claim 5, wherein the dispensing step includes applying the adhesive with an adhesive dispenser having a body portion and a dispenser tip, the dispenser tip comprising a first portion which engages the body portion of the dispenser and a distal portion extending outwardly from the first portion, the distal portion including a flexible tube and a rigid sleeve, the flexible tube at least partially disposed within and protruding from the rigid sleeve.

9. The method of claim 5, wherein the application of adhesive through the dispenser causes deflection of the pellicle membrane.

10. The method of claim 1, wherein the adhesive is selected to retain its spatial and positional integrity and its adhesive properties over extended time periods, agitation and exposure to electromagnetic radiation such as that utilized in pellicle film inspection.

11. A method of preparing an optical pellicle having a pellicle membrane and a pellicle frame, comprising:

tensioning the pellicle membrane;

dispensing a quantity of adhesive onto the pellicle membrane in a pattern corresponding to the shape of the pellicle frame; and attaching the pellicle frame and the pellicle membrane so that the adhesive adheres the pellicle membrane to the pellicle frame.

12. The method of claim 11, wherein the adhesive is selected to retain its spacial and positional integrity and its adhesive properties over extended time periods, agitation and exposure to electromagnetic radiation such as that utilized in pellicle film inspection.

13. The method of claim 11, wherein the dispensing step includes applying the adhesive with an adhesive dispenser having a dispenser tip with a flexible distal portion.

14. The method of claim 11, wherein the dispensing step includes applying the adhesive with an adhesive dispenser having a dispenser tip with a rigid distal portion.

15. The method of claim 11, wherein the adhesive dispenser includes a distal portion having a flexible tube and a rigid sleeve, said flexible tube at least partially disposed with and partially protruding from the rigid sleeve.

16. The method of claim 11, wherein the dispensing step includes applying the adhesive with an adhesive dispenser which operatively engages the pellicle membrane.

17. The method of claim 16, wherein the adhesive dispenser includes a dispenser tip with a flexible distal portion.

18. The method of claim 16, wherein the adhesive dispenser includes a dispenser tip with a rigid distal portion.

19. The method of claim 16, wherein the adhesive dispenser includes a distal portion having a flexible tube and a rigid sleeve, said flexible tube at least partially disposed with and partially protruding from the rigid sleeve.

20. The method of claim 16, wherein the application of adhesive through the dispenser causes deflection of the pellicle membrane.

* * * * *